United States Patent [19]

Herrick

[11] Patent Number: 5,460,034
[45] Date of Patent: Oct. 24, 1995

[54] METHOD FOR MEASURING AND ANALYZING SURFACE ROUGHNESS ON SEMICONDUCTOR LASER ETCHED FACETS

[75] Inventor: Robert W. Herrick, Hazelwood, Mo.

[73] Assignee: The United States of America as represented by the Secretary of the Air Force, Washington, D.C.

[21] Appl. No.: 917,546

[22] Filed: Jul. 21, 1992

[51] Int. Cl.$^6$ .............................. G01N 27/00; H01J 37/26
[52] U.S. Cl. .............................. 73/105; 250/306; 250/307; 437/8
[58] Field of Search .............................. 437/5, 4, 8; 73/105; 250/306, 307

[56] References Cited

U.S. PATENT DOCUMENTS

| | | | |
|---|---|---|---|
| 3,720,818 | 3/1973 | Sprang et al. | 73/105 |
| 4,084,324 | 4/1978 | Whitehouse | 73/105 |
| 4,575,630 | 3/1986 | Lukianoff. | |
| 4,670,650 | 6/1987 | Matsuzawa et al. | 250/307 |
| 4,675,528 | 6/1987 | Langner et al. | 250/307 |
| 4,777,364 | 10/1988 | Sartore | 250/306 |
| 4,794,646 | 12/1988 | Takeuchi et al. | 250/306 |
| 4,866,782 | 9/1989 | Sugie et al. | 382/22 |
| 4,866,783 | 9/1989 | Ohyama | 382/23 |
| 5,016,099 | 5/1991 | Bongardt et al. | 73/105 |
| 5,040,231 | 8/1991 | Terzian | 382/34 |
| 5,055,679 | 10/1991 | Ninomiya et al. | 250/306 |
| 5,093,572 | 3/1992 | Hosono | 250/306 |
| 5,095,207 | 3/1992 | Tong | 250/307 |
| 5,134,288 | 7/1992 | Van Dijck | 250/307 |
| 5,200,618 | 4/1993 | Saldin et al. | 250/306 |
| 5,278,408 | 1/1994 | Kakibayashi et al. | 250/307 |

OTHER PUBLICATIONS

Paper entitled "Analysis of Surface Roughness on Semiconductor Laser Etched Facets", presented at Proceedings of Microfabrication Conference, Newport Beach, Ca, Aug. 1, 1991, pp. 43–44.
Viewgraphs presented at Microfabrication Conference.
Paper entitled "Novel method for measuring and analyzing surface roughness on semiconductor laser etched facets", by Robert W. Herrick et al, J. Vac. Sci. Technol. B 9(6), Nov./Dec. 1991, pp. 2778–2783.

Primary Examiner—Richard E. Chilcot, Jr.
Assistant Examiner—George Dombroske
Attorney, Agent, or Firm—Robert L. Nathans

[57] ABSTRACT

A scanning electron microscope is used to scan the etched facet edge to produce digital data representative of its profile. A Fourier transform of the edge profile is produced and the resulting plurality of spatial frequency components can be used to generate a first low frequency waveform component indicative of lack of precise edge definition, a midrange frequency component indicative of poor liftoff samples, and a high frequency component indicative of metal grain size. A tilt adjustment feature of the electron microscope is optionally used to advantageously magnify the shape of the profile in the y direction.

3 Claims, 1 Drawing Sheet

METHOD FOR MEASURING AND ANALYZING SURFACE ROUGHNESS ON SEMICONDUCTOR LASER ETCHED FACETS

STATEMENT OF GOVERNMENT INTEREST

The invention described herein may be manufactured and used by or for the Government for governmental purposes without the payment of any royalty thereon.

BACKGROUND OF THE INVENTION

Monolithic integration of opto-electronic devices requires the development of techniques to produce extremely smooth etched laser facets. Such facets are essential to the development of many photonic devices, as well as being used in turning-mirror fabrication, and etched facet lenses. Etched facets have also been used to produce monolithic unstable resonator designs with low divergence and single longitudinal mode operation from a broad area semiconductor laser. Additionally, etched facets are being considered for wafer-level facet coating and wafer level testing to reduce required part handling. While the wide-stripe resonators fabricated to date have proven capable of matching the performance of conventional cleaved facet lasers, a further reduction of facet roughness is needed for advanced photonic devices. Low surface roughness is essential to maximizing facet reflectivity, minimizing beam divergence and scattering loss, and in turning mirrors, minimizing backscatter. Extremely low surface roughness is also essential to the fabrication of quantum wire lasers.

The ideal technique for evaluating etched facets would have the following characteristics: (a) uses only commonly available laboratory equipment; (b) evaluates facets independently of other processes (i.e., test results of different facet etching techniques are not biased by other variables such as starting wafer quality or the contact resistance of the diode); (c) is sensitive to relatively small changes in facet quality from run to run; (d) is sensitive to all sources of facet roughness, including poor photolithography or linewidth control, or grainy photoresist or masking materials; (e) is quick and requires little sample preparation; and (f) is nondestructive, and can be used as a quality check on the facets before further processing is performed on a wafer with unknown facet quality. On these counts, the technique described herein; (a) requires only a scanning electron microscope S(EM) and a low-cost photo scanner; (b) acquires the actual facet profile and does not infer roughness from ambiguous electro-optic measurements; (c) can reproducibly detect changes of less than 10% from run to run, unlike subjective facet evaluation which cannot accurately detect changes in roughness less than 30%, (d) detects even slow deviations from the intended facet profile (due to lithographic resolution limitations) which go unnoticed when examining typical SEM photographs; (e) requires no sample preparation and takes less than two hours to perform all aspects of the analysis shown below: and (f) is completely nondestructive (although resolution is improved by applying a conductive coating where nondestructive analysis is not required). Previously, facet quality has either been inferred by comparing the slope efficiency of an etched-facet laser to a similar cleaved-facet laser, or evaluated qualitatively by estimating the size of sidewall striations. The technique takes advantage of the "tilt adjustment" feature on the SEM to provide y scale expansion, simultaneously capturing information from a wide area in the x axis, while giving high magnification in the y axis. The resulting SEM photo is then digitized to provide the actual facet profile. This technique provides what we believe to be the first quantitative evaluations of etched facet roughness, which should prove helpful in comparing devices fabricated by different processes, as well as predicting device performance using techniques of numerical analysis. This technique takes the Fourier transform of the surface profile, and shows that the surface roughness is composed of three distinct components, resulting from different physical effects. We believe this method has broad applicability to process control and accurate numerical analysis.

BRIEF SUMMARY OF THE INVENTION

The method of the invention gives direct quantitative results. A scanning electron microscope is used to scan the etched facet edge to produce digital data representative of its profile. A Fourier transform of the edge profile is produced and the resulting plurality of spatial frequency components can be used to generate a first low frequency waveform component indicative of lack of precise edge definition, a midrange frequency component indicative of poor liftoff samples, and a high frequency component indicative of metal grain size. A tilt adjustment feature of the electron microscope is optionally used to advantageously magnify the shape of the profile in the y direction.

BRIEF DESCRIPTION OF THE DRAWINGS

Other objects, features and advantages of the present invention will become apparent upon study of the following description, taken in conjunction with the drawings in which.

DETAILED DESCRIPTION

Figure 1A:
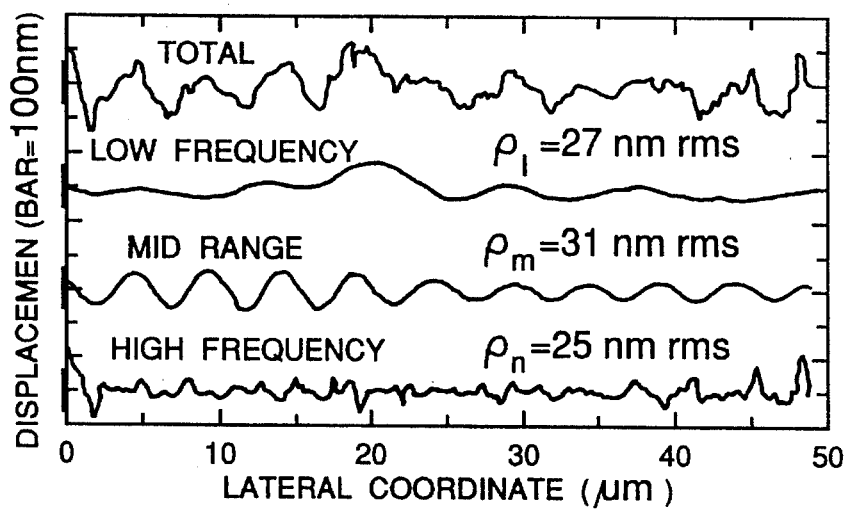
FIG. 1a illustrates the three spectral components or composite waveforms produced by the inverse Fourier transform step and the actual reconstructed roughness profile.

All of the etched facets in this study were fabricated from metal-organic, chemical vapor deposition (MOCVD) grown AlGaAs/GaAs graded-index, separate confinement heterostructure, single quantum well (GRIN-SCH-SQW) epitaxy, with growth conditions and dimensions as reported previously. Most devices were then masked using a 1200-A-thick nickel lift-off mask, as reported previously, although a few devices used a 6000-A-thick patterned oxide mask. After masking, the devices were etched at about 2.2 microns using a chemically assisted ion-beam etching (CAIBE) process to produce smooth, vertical sidewalls. In all devices, the facet striations followed the imperfections in the mask itself, consistent with previous investigations. M. A. Bosch, L. A. Coldren, and E. Good, Appl. Phys. Lett 38 264 (1981). As in previous work, this produced a "shower curtain" profile, where the profile at the top edge was virtually identical to the profile at the base of the mirror. In this work, we examine the mask edge, or the top edge of the etched facet after the mask has been removed.

We examined the facet edges at normal incidence using an ISI DS-130 scanning electron microscope (SEM) at magnifications ranging from 2000 to 50 000 X. In addition, on a few samples, the substrate was etched away to allow a 50 000 X transmission electron microscopy (TEM) "shadow profile" of the etched facet to be captured (also taken at normal incidence). This was done to verify that no small scale surface roughness was present beyond that within SEM resolution limits. We believe that the lack of small-scale roughness, along with the (nonuniform) distribution shown in our roughness spectral density curves, precludes the description of the roughness profile in terms of fractal geometry. To enhance the surface roughness, the "tilt correction" feature of the SEM was used. This feature increases the effective magnification in the y axis. The tilt adjustment knob is wired into a y axis amplifier circuit which decreases extent of the y area scanned while not affecting the video or photo circuits. This is equivalent to increasing the y magnification while leaving x magnification unaffected. A good explanation can be found in any of the JEOL SEM users manuals, for example, JSM-840 *Scanning Electron Microscope Manual* (JEOL, Tokyo, 1983), pp. 1.32–1.34, and pp. SRT40.1–7. The "tilt correction" feature of the SEM improves the accuracy of subsequent measurements by reducing the importance of "blooming: between adjacent display pixels, limited film resolution, and scanner quantitization noise. The photo display is made up of 570 lines per inch, while film resolution is on the order of 300–500 lines per inch. The latter is particularly a problem with smooth samples where without tilt correction (using a 10 000 X SEM photograph with a scanner resolution of 300 dpi), the pixel size will be 8.5 nm, where the rms roughness is often less than 10 nm. The y scale expansion provided by the tilt correction feature on the ISI DS-130 magnifies y axis pixel size to nearly 1 nm per pixel by exaggerating the roughness by a factor of 8. Note that this is also coming close to the limits of edge-location resolution. The instrument can resolve two separate objects 6 nm distant. However, our requirements are much less stringent than resolving separate objects, as we only need to detect a shift in the edge profile.

Note that the use of selective y scale expansion, while helpful, is not essential. It would be possible to gather the same data from a mosaic of micrographs, provided the sample was not rotated between photographs in the SEM, and the photographs were carefully aligned on the photo scanner. For example, a single photograph with y scale expansion of 8 (x mag=10 000 X,y mag=80 000 X) could be replaced by a mosaic of nine or more overlapping images (with x and y mag–80 kx). The use of the tilt adjustment to selectively stretch the y axis without providing unneeded x axis resolution is thus primarily labor-saving. It should be noted that, in accordance with the Nyquist sampling theorem, we only need to take samples along the x axis at twice the highest frequency component. We found no detectable difference in the spectra observed with samples taken as far as 0.16 microns apart, which is not surprising given the fact that the highest frequencies observed are on the order of 0.2 microns. Thus, while we need high longitudinal (y axis) resolution to keep quantitization noise low, our lateral (x axis) resolution requirements are approximately two orders of magnitude lower for the samples we have reported on. This follows because the height of the features is considerably smaller than their width, a fact which should be evident by carefully examining FIG. 2, while keeping in mind that the y axis scale is nearly 50 times the x axis scale. To clarify the technique, most of the following micrographs are taken from earlier, poor quality samples, with more pronounced surface roughness.

No special sample preparation is necessary, and this technique has been used to monitor full 2-in. wafers as a nondestructive in-process test. However, standard conducive coating techniques were used to improve contrast and resolution (by reducing surface charge buildup) on all samples not intended for further processing. Before-and-after micrographs showed no change in the observed profiles due to the gold coating (not surprising given the width of the features compared with the thickness of the 100 Å gold coating). However, without the gold coating, space charging effects reduce the resolution of the SEM to perhaps 10 nm (vs 6 nm with conductive coating). The SEM photographs were digitized by an HP Scan-Jet photo scanner connected to an IBM AT with Microsoft "Scangal" software, and the photographic data was converted into a profile using a simple threshold triggered edge-detection algorithm. While the technique used in this work utilized a relatively straight-forward threshold detection algorithm with continuity checks, those with access to signal processing software may wish to refer to the following and references therein to "skeletonize" their image: J. E. Mazille, J. Microscopy 156, 3 (1989). Standard least-squares techniques are used to eliminate any vertical offset or scan rotation picked up during the photo scanning process. The data is shifted so that its average value is zero, and a first-order term is added to eliminate the appearance that values are rising or falling over the width of the mirror. Such an appearance results from imperfect alignment of the sample within the SEM, and imperfect alignment of the photographs on the scanner. Note that an integral number of cycles must be used to obtain good results; partial cycle data was discarded. At this stage, the acquired profile can be characterized for surface roughness. Root-mean-squared (rms) roughness is measured using the formula $$\rho = \sqrt{\frac{\Sigma_{i=1}^{n} y_i^2}{n}},$$

where $\rho$ is the surface roughness (usually measured in nm rms), y is the deviation from the ideal facet profile (in nm), and n is the number of points in the one-dimensional vector y. Roughness can also be expressed $R_a$ (average roughness), which was approximately 0.8 times $R_{rms}$ (root-mean-square roughness) in the samples examined. The formula is shown in: The American Society of Mechanical Engineers, *Surface Texture (Surface Roughness, Waviness, and Lay)* (ANSI/ASME, New York, 1985), p. 30. In addition, there are several fundamental causes of facet roughness, and it is often revealing to analyze the facet profile using Fourier analysis techniques. A. V. Oppenheim and R. W. Schafer, *Digital Signal Processing* (Prentice-Hall, Englewood Cliffs, 1975) pp. 239–250. R. W. Ramirez, *The FFT, Fundamentals and Concepts* (Prentice-Hall, Englewood Cliffs, 1985), pp. 124–143. In the Fourier analysis, the waveform, in this case the facet profile, is transformed into its frequency components. FIGS. 1a, b, show that the nonideality of the profile is characterized by three frequency components, which we refer to as "edge wander" (characterized by a very wide, 10–30- micron period), "bumpiness" (characterized by a 2–5- micron period), and "striations" or "surface roughness" (which covers everything smaller than 2 microns). These limits have been set by examining dozens of wafers fabricated using different processes. Each of the three frequency components is caused by different effects, as explained below. The bumpiness in FIG. 1a (with a 5- micron period) fits 200 cycles per mm or 0.2 cycles per micron, hence the spatial frequency peak at 0.2 microns.

Note that of the three components, only the third (surface roughness) has been reported in the literature, since subjective evaluation of SEM photos only shows features with large height-to-width aspect ratios. Slow changes in edge profile do not create similar strong "shadows: in the SEM photograph, and thus generally go unrecognized, even through they have an important effect on device performance. Using the analytical technique of Iga et al., degradation of facet reflectivity depends only on the magnitude of the roughness, and is independent of its spatial frequency. Examining FIGS. 1a, 1b, 73% of the roughness comes from the two lower-frequency components. Even in the best case, with the patterned oxide mask (which has not bumpiness component), edge wander accounts for about 20% of the overall facet deviation.

Figure 2:
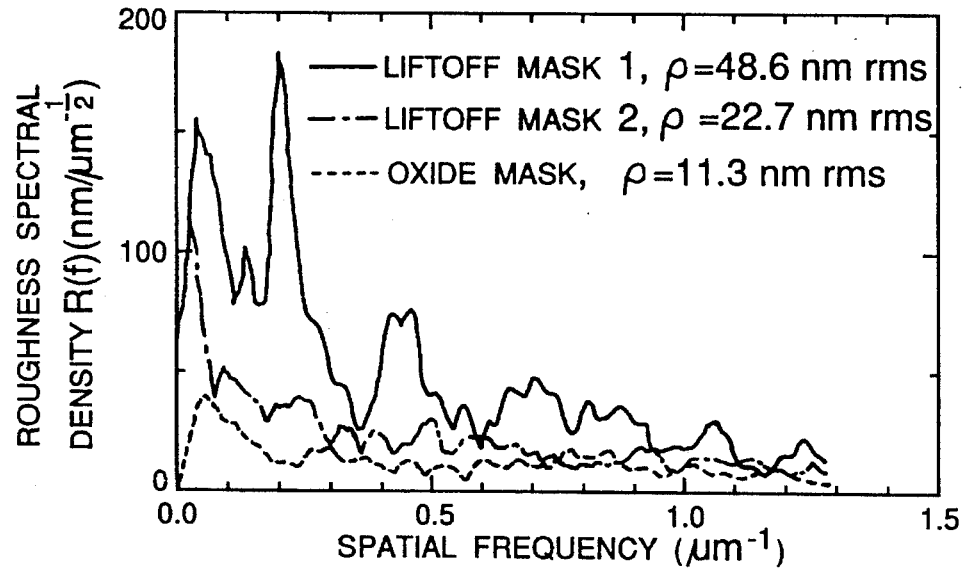
FIG. 2 shows three representative facet spectra.

We observe, from the analysis of dozens of samples, that the small, high-frequency striations do not appear to vary greatly from run-to-run, while order-of-magnitude differences in the first two components (edge-wander and bumpiness) are often observed when examining facets produced with the lift-off technique. Furthermore, facets etched into wafers with good surface morphology (i.e. substrates, GaAs epitaxy on GaAs, or high-quality AlGaAs epitaxial growths) invariable show low edge wander and bumpiness. From these observations, as well as a consideration of the possible causes of nonideality, we postulate that the two lower-frequency components (edge-wander and bumpiness) are controlled by photolithographic resolution. When wafer-to-mask separation is increased (either voluntarily in a proximity aligner, or forcibly by epitaxial spikes or large particulates interfering with good contact), poor line edge resolution increases edge drift. S. M. Sze, *VLSI Technology*, 2nd ed. (McGraw-Hill, New York, 1988), Chap. 4. We attribute the higher-frequency striations to nickel grain size in the case of the metal lift-off mask, or photoresist molecular agglomeration size in the case of the patterned amorphouse oxide mask. The former was verified by using a nickel grain boundary etch to show grain size; the distribution of sizes corresponded well with the distribution of striation dimensions. The latter evolution of striations in patterned oxide masks is well documented in Saito and Noguchi, (H. Saito and Y. Noguchi, Jpn. J. Appl. Phys. 28, 1836 (1989)) who show that the oxide mask takes on the roughness profile of the photoresist during the patterning etch, and then passes along this profile to the facet during the etching process. However, from FIG. 2, we see that the striation size is smaller on the oxide mask than on the nickel mask (i.e., the photoresist molecular agglomeration size is smaller than the nickel grain size), consistent with previous observations. FIG. 2 also shows that the patterning technique has lower edge wander, which is not surprising given the better linewidth control of patterning techniques over liftoff generally. Note that the oxide mask rms roughness (11.3 nm) is less than $\lambda_n/20$ ($\lambda_{fs}$= 860 nm, n=3.266, $\lambda_n/20$= 13.5 nm), which is generally smooth enough for nearly any application, and is almost indistinguishable from a cleaved facet in optical performance. Indeed, facet striations are virtually undetectable in even high magnification (50 000 X) SEM photographs without this technique. The only applications we are aware of that would benefit from lower surface roughness are those with turning mirrors which need extremely low backscatter, particularly large multielement traveling wave amplifiers. FIG. 2 indicates that the patterned oxide mask is capable of lower roughness than comparable metal lift-off masks. Note that across the entire spectrum, the oxide mask has lower roughness, with less edge-wandering, smaller striations, and no discernible bumpiness peak.

Figure 1B:
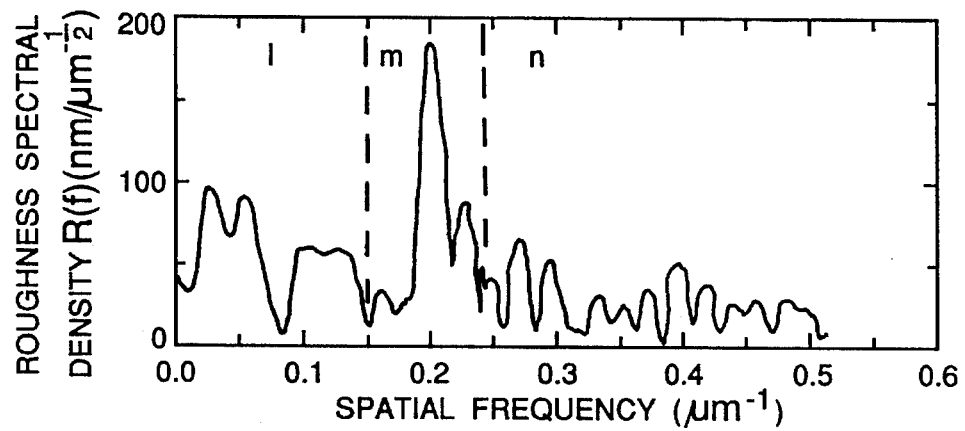
FIG. 1b illustrates the Fourier transform of the shape of the edge profile.

Numerical analysis of facet reflectivities is helpful in predicting the smoothness required, and in assisting in design optimization. For some parameters, such as turning mirror backscatter, which cannot be directly measured, accurate surface profiles such as those provided by the above technique are essential. Some previous analyses have used white noise (which gives a uniform spectral distribution, with unrealistically large high-frequency components, and striations much higher than they were wide). Other analyses have used a simple sinusoid, which may be reasonably accurate in analyzing laser facets, but is quite inaccurate for turning mirrors because of the grating lobes it creates (in the spectral domain it would be a single spike, rather than the correct distribution of components as shown in FIGS. 1a, 1b and 2.). Our subsequent analysis of turning mirror reflectivities, using white Gaussian noise passed through a low pass filter, is close to the actual case, although the spatial frequencies selected did not quite match the actual distribution. More recent analysis has been done with a summation of three spectral components, based on the Fourier analyses discussed above. Using the actual profile as a computer input should significantly improve accuracy over any of the aforementioned approximations, and is planned for future work.

A novel technique for measuring and analyzing surface roughness with substantial improvement over existing techniques has been introduced. We have shown that edge-wander, a slow drift from the desired profile, which goes unnoticed in typical visual SEM analysis, accounts for a significant portion of the surface roughness of etched facets. Application to process control and numerical analysis has also been shown.

While preferred embodiments of the present invention have been described, numerous variations will be apparent to the skilled worker in the art, and thus the scope of the invention is to be restricted only by the terms of the following claims and art recognized equivalents thereof.

What is claimed is:

1. Method of measuring surface characteristics of a semiconductor facet having a surface profile comprising the steps of:

(a) digitizing data representative of said surface profile to produce digitized data;

(b) taking the Fourier transform of said digitized data;

(c) taking the inverse Fourier transform of spatial frequency spectrum components resulting from the execution of step (b) and reconstructing three waveform components therefrom wherein:

(d) a first waveform component has a 10–30 micron period for measuring the extent of edge wander, a second waveform component has a 2–5 micron period for measuring the extent of bumpiness and a third waveform component has periods of less than two microns for measuring the extent of surface roughness.

2. The method of claim 1 wherein step (a) includes scanning said semiconductive facet with a scanning electron microscope having a given effective magnification.

3. The method of claim 2 including the step of increasing the effective magnification of said semiconductor facet in the y direction during the performance of step (a).

\* \* \* \* \*